(12) United States Patent
Liao et al.

(10) Patent No.: US 11,539,340 B2
(45) Date of Patent: Dec. 27, 2022

(54) FILM BULK ACOUSTIC RESONATOR

(71) Applicant: WUHAN YANXI MICRO COMPONENTS CO., LTD., Hubei (CN)

(72) Inventors: Pei-Chun Liao, Hubei (CN); Re-Ching Lin, Hubei (CN); Junwu Zhao, Hubei (CN)

(73) Assignee: WUHAN YANXI MICRO COMPONENTS CO., LTD., Hubei (CN)

( * ) Notice: Subject to any disclaimer, the term of this patent is extended or adjusted under 35 U.S.C. 154(b) by 746 days.

(21) Appl. No.: 16/544,984

(22) Filed: Aug. 20, 2019

(65) Prior Publication Data

US 2019/0372548 A1 Dec. 5, 2019

Related U.S. Application Data

(63) Continuation of application No. PCT/CN2018/125238, filed on Dec. 29, 2018.

(30) Foreign Application Priority Data

Jan. 19, 2018 (CN) .......................... 201810051954.3
Jan. 19, 2018 (CN) .......................... 201820096098.9
(Continued)

(51) Int. Cl.
*H03H 9/02* (2006.01)
*H03H 9/13* (2006.01)
*H03H 9/17* (2006.01)

(52) U.S. Cl.
CPC ...... *H03H 9/0211* (2013.01); *H03H 9/02031* (2013.01); *H03H 9/132* (2013.01);
(Continued)

(58) Field of Classification Search
CPC .. H03H 9/0211; H03H 9/02031; H03H 9/132; H03H 9/173; H03H 9/174; H03H 9/175
See application file for complete search history.

(56) References Cited

U.S. PATENT DOCUMENTS 6,812,619 B1 11/2004 Kaitila
7,369,013 B2 5/2008 Fazzio
(Continued)

FOREIGN PATENT DOCUMENTS

CN 1364339 A 8/2002
CN 1794572 A1 6/2006
(Continued)

OTHER PUBLICATIONS

State Intellectual Property Office of People's Republic of China, "International Search Report for PCT Application No. PCT/CN2018/125238", China, dated Mar. 6, 2019.
(Continued)

*Primary Examiner* — Bryan P Gordon
(74) *Attorney, Agent, or Firm* — Syncoda LLC; Feng Ma (57) ABSTRACT

The invention provides a film bulk acoustic resonator including a layered structure composed of a top electrode, a piezoelectric layer and a bottom electrode, and a substrate; a reflective interface is arranged between the bottom electrode and the substrate; and by defining the shape of all or part of the layered structure, the purpose of suppressing the lateral mode can be achieved, and without adding new process, the manufacturing cost of the device can be controlled, and the benefit of product development can be maximized.

17 Claims, 11 Drawing Sheets

(30) Foreign Application Priority Data

Feb. 5, 2018 (CN) .......................... 201810113583.7
Feb. 5, 2018 (CN) .......................... 201820198355.X

(52) U.S. Cl.
CPC ............ H03H 9/173 (2013.01); H03H 9/174 (2013.01); H03H 9/175 (2013.01)

(56) References Cited

U.S. PATENT DOCUMENTS

| | | |
|---|---|---|
| 7,791,434 B2 | 9/2010 | Fazzio |
| 8,230,562 B2 | 7/2012 | Fazzio |
| 9,219,464 B2 | 12/2015 | Choy |
| 2005/0146242 A1 | 7/2005 | Inoue |
| 2006/0071736 A1 | 4/2006 | Ruby |
| 2006/0132262 A1 | 6/2006 | Fazzio |
| 2006/0226932 A1 | 10/2006 | Fazzio |
| 2007/0279153 A1* | 12/2007 | Ruby ............... H03H 9/174 333/191 |
| 2008/0060181 A1 | 3/2008 | Fazzio |
| 2008/0258842 A1 | 10/2008 | Ruby |
| 2010/0148636 A1 | 6/2010 | Nishihara et al. |
| 2010/0156565 A1 | 6/2010 | Oka et al. |
| 2012/0182090 A1 | 7/2012 | Pang |
| 2013/0063227 A1* | 3/2013 | Burak ............... H03H 9/02118 333/187 |
| 2013/0106534 A1* | 5/2013 | Burak ............... H03H 9/173 333/187 |
| 2014/0118090 A1* | 5/2014 | Grannen ............ H03H 9/02015 333/187 |
| 2014/0125202 A1* | 5/2014 | Choy ............... H03H 9/175 310/365 |
| 2014/0139077 A1* | 5/2014 | Choy ............... H03H 9/02149 310/365 |
| 2014/0203686 A1 | 7/2014 | Song et al. |
| 2016/0118958 A1 | 4/2016 | Burak et al. |
| 2017/0338399 A1 | 11/2017 | Kim et al. |

FOREIGN PATENT DOCUMENTS

| | | |
|---|---|---|
| CN | 1845453 A | 10/2006 |
| CN | 1951005 A | 4/2007 |
| CN | 101361266 A | 2/2009 |
| CN | 106849897 A | 6/2017 |
| CN | 107404304 A | 11/2017 |
| CN | 108134588 A | 6/2018 |
| CN | 108134589 A | 6/2018 |
| CN | 207869078 U | 9/2018 |
| CN | 207869079 U | 9/2018 |
| GB | 2424775 A | 10/2006 |
| GB | 2427773 A | 1/2007 |
| JP | 2002372974 A | 12/2002 |
| JP | 2005159402 A | 6/2005 |
| JP | 2006245979 A | 9/2006 |
| JP | 2006352854 A | 12/2006 |
| JP | 2007325269 A | 12/2007 |
| JP | 2008042871 A | 2/2008 |
| JP | 2009246569 A | 10/2009 |
| WO | 2009028027 A1 | 3/2009 |

OTHER PUBLICATIONS

English translation of the Written Opinion of the International Search Authority in the international application No. PCT/CN2018/125238, dated Mar. 6, 2019.

Thalhammer Robert et al: "Finite-Element Analysis of Bulk-Acoustic-Wave Devices: A Review of Model Setup and Applications", IEEE Transactions on Ultrasonics, Ferroelectrics and Frequency Control, vol. 63, No. 10, Oct. 2016 (Oct. 2016) pp. 1624-1635, XP011624446.

Li Xinyi et al: "Use of double-raised-border structure for quality factor enhancement of type II piston mode FBAR", IEEE Joint Conference of the European Frequency and Time Forum and IEEE International Frequency Control Symposium, Jul. 9, 2017 (Jul. 9, 2017), pp. 547-550, XP033242034.

Supplementary European Search Report in the European application No. 18901250.3, dated Dec. 2, 2020.

* cited by examiner

FILM BULK ACOUSTIC RESONATOR

CROSS-REFERENCE TO RELATED APPLICATIONS

This application is a continuation application of International Patent Application No. PCT/CN2018/125238 filed Dec. 29, 2018, which itself claims priority to and the benefit of Chinese Patent Application Nos. 201810051954.3 filed Jan. 19, 2018, 201820096098.9 filed Jan. 19, 2018, 201810113583.7 filed Feb. 5, 2018, and 201820198355.X filed Feb. 5, 2018, in the State Intellectual Property Office of P.R. China, which are hereby incorporated herein in their entireties by reference.

TECHNICAL FIELD

The present invention relates to the field of resonators, and particularly relates to a film bulk acoustic resonator.

BACKGROUND

With the evolution of communication frequency bands, the required frequency is getting higher and higher. In order to reduce the loss of the filter and obtain a filtering response of higher quality, the resonator needs to provide better Q value under the demand of high frequency. There are many ways to increase the Q value by suppressing lateral mode, but most of them need to increase the number of process layers, which will inevitably increase the manufacturing cost of a device.

SUMMARY

One of the objectives of the present invention is to provide a film bulk acoustic resonator to solve the existing technical problem, which can not only suppress the transverse mode effect, but also control the manufacturing cost of the device through improvement without additional process layers.

The technical solution relating adopted by the present invention to solve the technical problem is as follows: a film bulk acoustic resonator capable of suppressing the transverse mode effect, including a layered structure composed of a top electrode, a piezoelectric layer and a bottom electrode, and a substrate, and characterized in that a reflective interface is arranged between the bottom electrode and the substrate; and the outer perimeter of the layered structure is a closed line formed by connecting a curve and at least one straight line segment.

According to the technical solution, the curve is convex or concave.

According to the technical solution, the number of the straight line segments is two or more, and the angle between adjacent straight line segments is greater than 0 degrees and less than 180 degrees.

According to the technical solution, the reflective interface is a cavity between the bottom electrode and the substrate.

According to the technical solution, the reflective interface is formed by overlapping high acoustic impedance materials and low acoustic impedance materials.

According to the technical solution, at least one layer of the bottom electrode, the piezoelectric layer and the top electrode is provided with a protruding block or a grooved region, and the number of protruding blocks or grooved regions is at least one.

A film bulk acoustic resonator, comprising a substrate, a bottom electrode, a piezoelectric layer and a top electrode which are sequentially arranged from bottom to top, wherein, a reflective interface is arranged between the substrate and the bottom electrode, and characterized in that at least one layer of the bottom electrode, the piezoelectric layer and the top electrode has a different shape from the other layers.

According to the technical solution, the different shape means that, specifically, at least one protruding block is added.

According to the technical solution, the protruding block is an independent protruding block having a certain distance from the original structure of the layer in which the protruding block is located.

According to the technical solution, the certain distance is greater than 0 and less than or equal to 100 μm.

According to the technical solution, the protruding block is a connecting protruding block connected to the original structure of the layer in which the protruding block is located.

According to the technical solution, the different shape means that, specifically, at least one grooved region is arranged on the original structure.

According to the technical solution, the grooved region is arranged at any position in the edge or middle of the original structure.

According to the technical solution, the height of the grooved region is less than or equal to the thickness of the original structure.

According to the technical solution, the piezoelectric layer is made of a material with piezoelectric characteristics.

According to the technical solution, the material with piezoelectric characteristics is AlN, AlScN, ZnO, PZT, $LiNO_3$ or $LiTaO_3$.

According to the technical solution, the different shape means that, specifically, at least one protruding block is added, and at least one grooved region is arranged on the original structure.

The beneficial effect of the present invention is that by defining the shape of all or part of the layered structure, the purpose of suppressing the lateral mode can be achieved, and without adding new process, the manufacturing cost of the device can be controlled, and the benefit of product development can be maximized.

Reference numerals in the drawings: 101—top electrode, 102—piezoelectric layer, 103—bottom electrode, 104—cavity, 105—substrate; 201—top electrode, 202—piezoelectric layer, 203—bottom electrode, 204—cavity, 205—substrate; 301—top electrode, 302—piezoelectric layer, 303—bottom electrode, 305—substrate, 306—Bragg reflector; 401—top electrode, 4011—curve, 4012—straight segment, 402—piezoelectric layer, 403—bottom electrode; 501—top electrode, 5011—curve, 5012—first straight line segment, 5013—second straight line segment, 502—piezoelectric layer, 503—bottom electrode; 601—top electrode, 6011—curve, 6012—first straight line segment, 6013—second straight line segment, 6014—third straight line segment, 602—piezoelectric layer, 603—bottom electrode, 6016—top electrode protruding block; 1011—top electrode outer perimeter, 1012—linear edge, 1013—independent protruding block, 1014—connecting protruding block, 1015—grooved region, 10151—hollow grooved region, 10152—non-hollow grooved region, 1016—top electrode protruding block.

DETAILED DESCRIPTION

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this invention, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

As used in this invention, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this disclosure, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Figure 1:
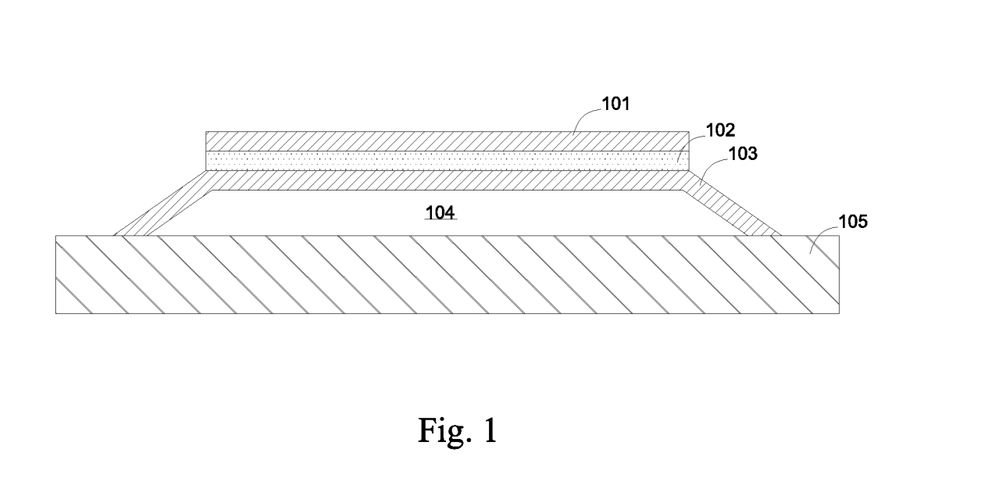
FIG. 1 is a sectional view of an embodiment of the present invention.

FIG. 1 is a sectional view of an embodiment of the present invention. The film bulk acoustic resonator includes a layered structure composed of a top electrode 101, a piezoelectric layer 102 and a bottom electrode 103, wherein, a cavity 104 is arranged between the bottom electrode 103 and the substrate 105, and the cavity 104 serves as a reflective interface.

Figure 2:
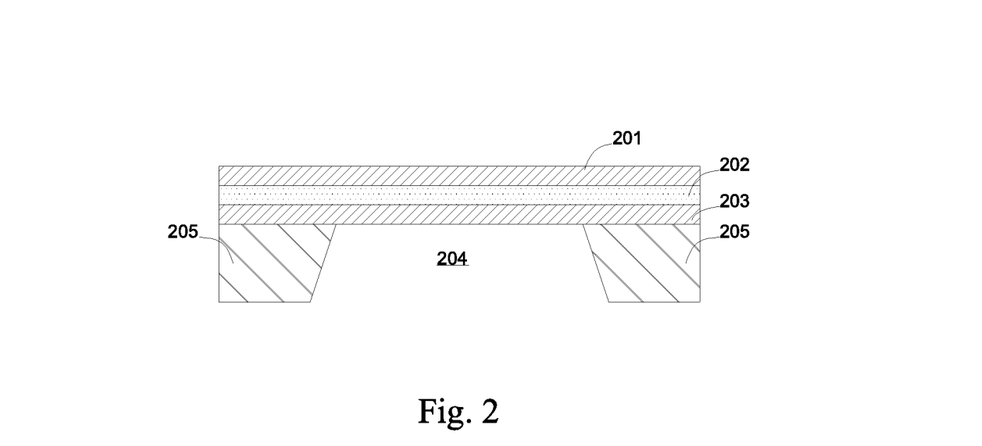
FIG. 2 is a sectional view of another embodiment of the present invention.

FIG. 2 is a sectional view of another embodiment of the present invention. The film bulk acoustic resonator includes a layered structure composed of a top electrode 201, a piezoelectric layer 202 and a bottom electrode 203, wherein, a cavity 204 formed by etching holes is arranged in a substrate 205, and the cavity 204 serves as a reflective interface.

Figure 3:
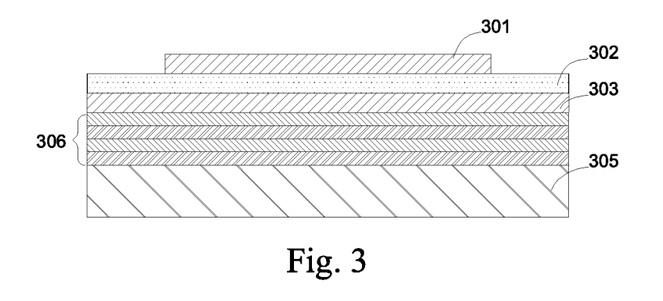
FIG. 3 is a sectional view of still another embodiment of the present invention.

FIG. 3 is a sectional view of still another embodiment of the present invention. The film bulk acoustic resonator includes a layered structure composed of a top electrode 301, a piezoelectric layer 302 and a bottom electrode 303, and a multi-layer Bragg reflector 306 formed by overlapping high acoustic impedance materials and low acoustic impedance materials is arranged between the bottom electrode 303 and a substrate 305, and the Bragg reflector 306 serves as a reflective interface. The high acoustic impedance and low acoustic impedance are relative concepts.

AN, AlScN, ZnO, PZT, LiNO$_3$ or LiTaO$_3$ with piezoelectric characteristics are adopted as the above piezoelectric layers.

Embodiment 1

Figure 4:
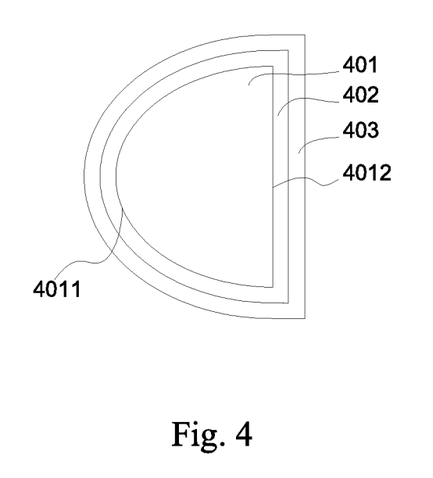
FIG. 4 is a top view of Embodiment 1 of the present invention.

As shown in FIG. 4, the film bulk acoustic resonator provided by this present embodiment includes a bottom electrode 403, a piezoelectric layer 402 and a top electrode 401 which are sequentially formed from bottom to top. The outer perimeter of the top electrode 401 is composed of a convex curve 4011 and a straight line segment 4012 for connecting two ends of the curve 4011. During manufacturing, only the outer perimeter of the growing layered structure needs to be defined in each process layer, and additional increasing of the number of process layers is not needed.

The present embodiment is applicable to film bulk acoustic resonators described in FIGS. 1, 2 and 3.

Embodiment 2

Figure 5:
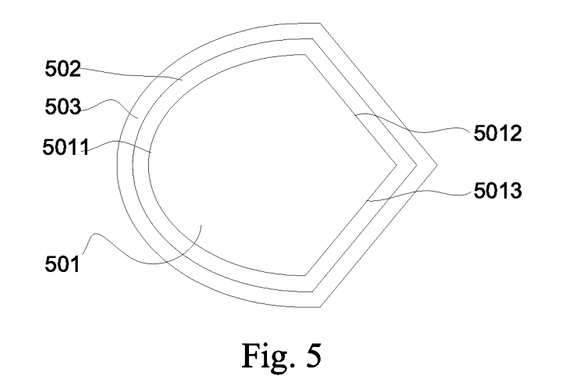
FIG. 5 is a top view of Embodiment 2 of the present invention.

The principle and structure of the present embodiment are basically the same as that of Embodiment 1 with differences as follows: as shown in FIG. 5, the film bulk acoustic resonator provided by this embodiment includes a bottom electrode 503, a piezoelectric layer 502 and a top electrode 501 which are sequentially formed from bottom to top. Taking the top electrode 501 as an example, the outer perimeter of the top electrode 501 is formed by connecting a convex curve 5011, a first straight line segment 5012 and a second straight line segment 5013. The angle between the first straight line segment 5012 and the second straight line segment 5013 is greater than 0 degrees and less than 180 degrees.

This embodiment is applicable to film bulk acoustic resonators described in FIGS. 1, 2 and 3.

Embodiment 3

Figure 6:
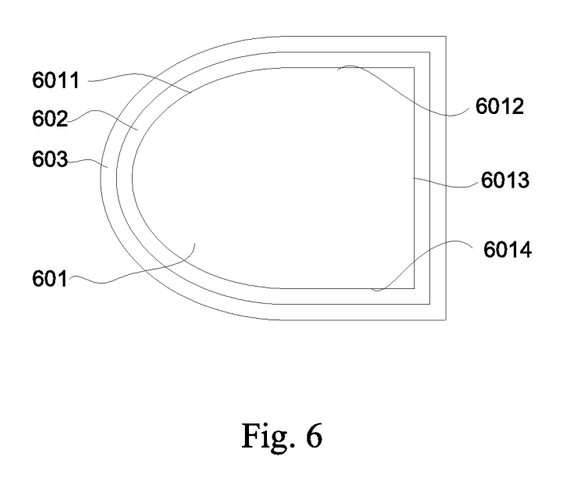
FIG. 6 is a top view of Embodiment 3 of the present invention.

The principle and structure of the present embodiment are basically the same as that of Embodiment 1 with differences as follows: as shown in FIG. 6, the film bulk acoustic resonator provided by this embodiment includes a bottom electrode 603, a piezoelectric layer 602 and a top electrode 601 which are sequentially formed from bottom to top. Taking the top electrode 601 as an example, the closed line of the top electrode 601 is formed by connecting a convex curve 6011, a first straight line segment 6012, a second straight line segment 6013 and a third straight line segment 6014. The first straight line segment 6012 and the third straight line segment 6014 are parallel to each other.

This embodiment is applicable to film bulk acoustic resonators described in FIGS. 1, 2 and 3.

The design idea of Embodiments 1 to 3 is to form an asymmetrical resonator by designing a shape consisting of only one curve edge and any other flat edge. The lateral mode will reflect in the asymmetrical piezoelectric layer to directions mostly different from that of the original wave, so that the energy of the lateral mode can be attenuated and finally the Q value can be increased. A closed shape formed by a curve edge plus any flat edge can be designed to be suitable for resonators with different requirements (e.g. requirements on Q value, shape, volume, etc.) by adjusting different flat edges and angles. It is more flexible in design as well as the flexible effect of suppressing lateral modes can be achieved.

In Embodiments 1 to 3, the outer perimeter of the layered structure is a closed line formed by connecting a curve and at least one straight line segment. The curve is convex or concave, such as circular, elliptic arc, parabolic or any smooth curves, but can only be bent towards one direction. The outer perimeter of the layered structure has only one curve surface and the other surfaces are all planar, thus forming an asymmetric geometric figure, so that the lateral modes formed are not in the same position when reflecting back, thereby being dispersed and offset; and without adding new technology, the manufacturing cost of the device is controlled, and the benefit of product development is maximized.

Embodiment 4

Figure 7:
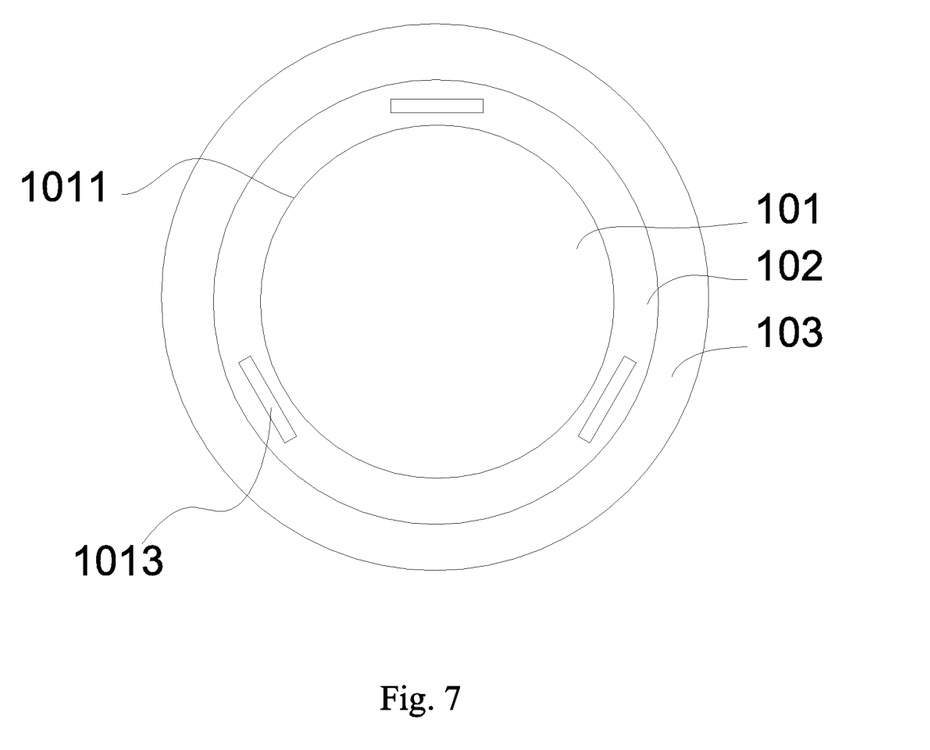
FIG. 7 is a top view of Embodiment 4 of the present invention.

The present embodiment provides a film bulk acoustic resonator, as shown in FIG. 7, which includes a substrate 105, a bottom electrode 103, a piezoelectric layer 102 and a top electrode 101 which are sequentially arranged from bottom to top, wherein, a reflective interface is arranged between the substrate 105 and the bottom electrode 103, and at least one protruding block that is made of the same material as the original structure of the layer in which the protruding block is located is added in at least one layer of the bottom electrode 103, the piezoelectric layer 102 and the top electrode 101; the protruding block has the same thickness as the original structure of the layer in which the protruding block is located. Then, the deposition process of the protruding block is the same as other structures in the layer in which the protruding block is located, and only protruding block pattern needs to be grown during the process.

In the present embodiment, the protruding block is an independent protruding block having a certain distance (greater than 0, less than or equal to 100 μm) from the original structure of the layer in which the protruding block is located. Further, the independent protruding block may not be limited to a square shape, and the length of each edge ranges from 1 nm to 100 μm.

Taking the top electrode 101 as an example, an independent protruding block 1013 is arranged in the same layer with the layer in which the top electrode 101 is located, and the distance between the independent protruding block 1013 and the top electrode outer perimeter 1011 is greater than 0, less than or equal to 100 um. In addition, an independent protruding block 1013 can be arranged on the top electrode 101, two independent protruding blocks can be arranged on the piezoelectric layer 102, and three independent protruding blocks can be arranged on the bottom electrode 103. The number of independent protruding blocks in each layer is not limited, and the layer in which the independent protruding blocks are arranged and the number of layers in which the independent protruding blocks are arranged are not limited.

The material of the piezoelectric layer is composed of materials with piezoelectric characteristics, such as AN, AlScN, ZnO, PZT, LiNO$_3$, LiTaO$_3$, BST, and other materials with piezoelectric characteristics or mixed materials with piezoelectric characteristics.

This present embodiment is applicable to film bulk acoustic resonators shown in FIGS. 1, 2 and 3.

Embodiment 5

Figure 8:
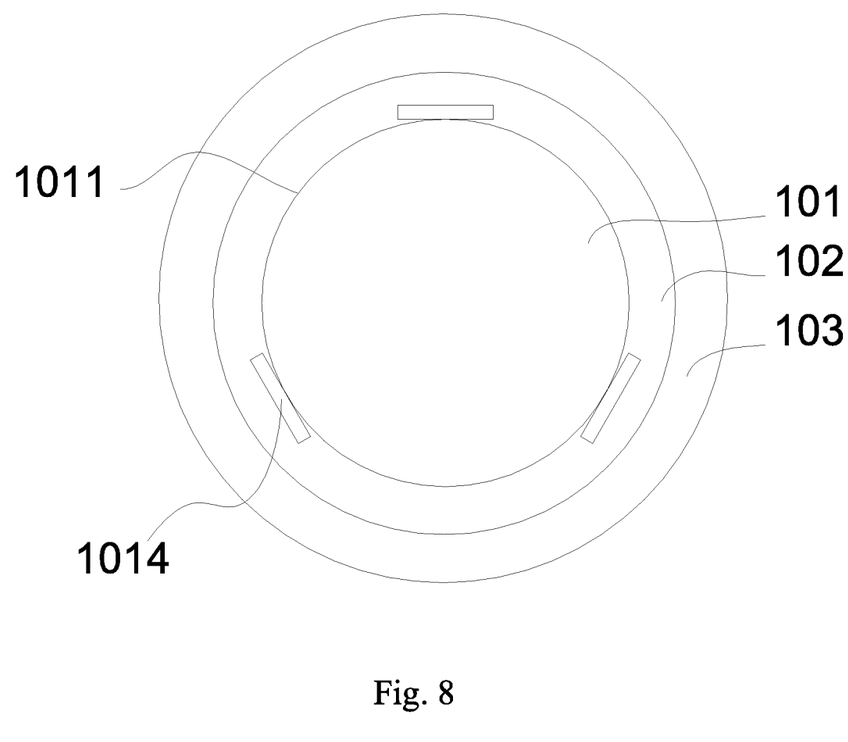
FIG. 8 is a top view of Embodiment 5 of the present invention.

The structure and principle of the present embodiment are the same as that of Embodiment 4 with differences as follows: as shown in FIG. 8, the protruding block is a connecting protruding block connected to the original structure of the layer in which the protruding block is located. The thickness of the connecting protruding block is the same as the layer in which the protruding block is located. The deposition process of the connecting protruding block is the same as that of other structures of the layer in which the protruding block is located, but only need to control the shape of the outer perimeter during the process.

The longest dimension range of the connecting protruding block is 1 nm-100 μm.

Taking the top electrode 101 as an example, three connecting protruding blocks 1014 are connected to any position on the top electrode outer perimeter 1011. In addition, one connecting protruding block 1014 can be connected to the top electrode 101, two connecting protruding blocks can be connected to the piezoelectric layer 102, and three connecting protruding blocks can be connected to the bottom electrode 103. The number of connecting protruding blocks in each layer is not limited, and the layer in which the connecting protruding blocks are arranged and the number of layers in which the connecting protruding blocks are arranged are not limited.

The material of the piezoelectric layer is composed of materials with piezoelectric characteristics, such as AN, AlScN, ZnO, PZT, LiNO$_3$, LiTaO$_3$, BST, and other material with piezoelectric characteristics or mixed materials with piezoelectric characteristics.

The present embodiment is applicable to film bulk acoustic resonators shown in FIGS. 1, 2 and 3.

Embodiment 6

Figure 9:
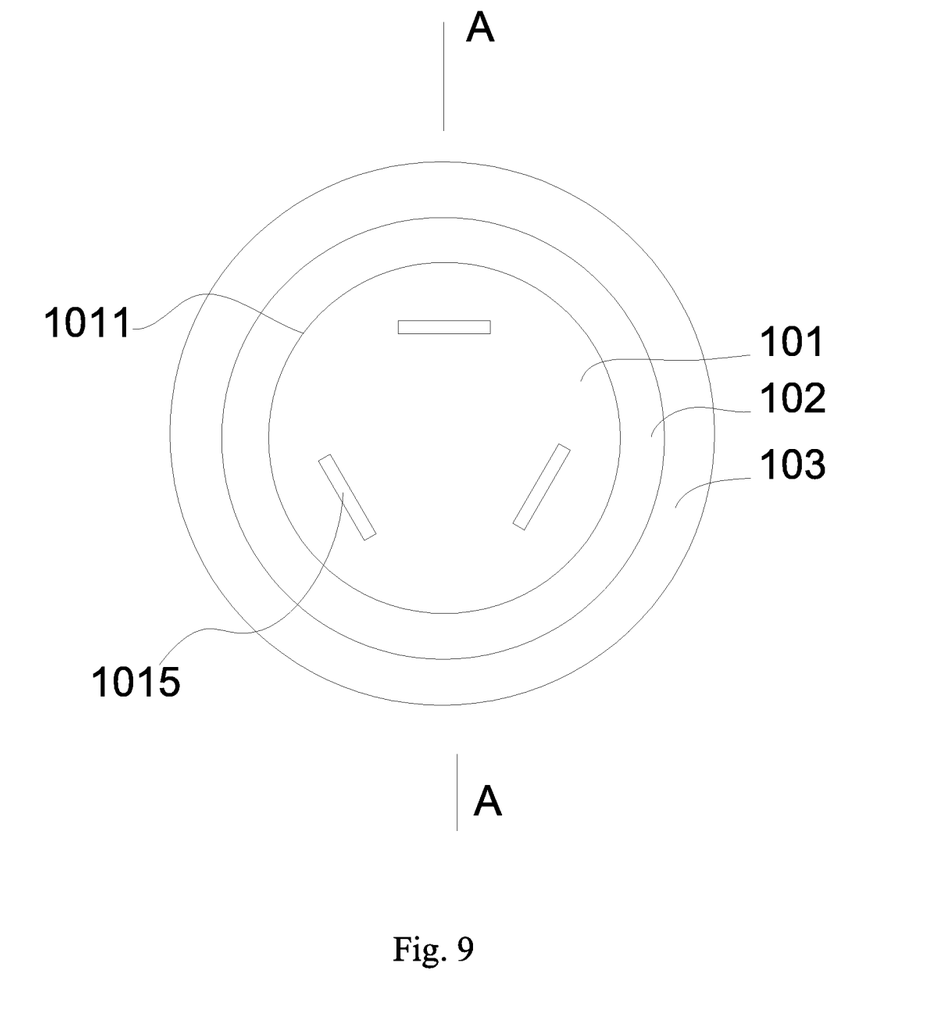
FIG. 9 is a top view of Embodiment 6 of the present invention.

The present embodiment provides a film bulk acoustic resonator comprising a substrate 105, a bottom electrode 103, a piezoelectric layer 102 and a top electrode 101 which are sequentially arranged from bottom to top, wherein, a reflective interface is arranged between the substrate 105 and the bottom electrode 103, and at least one layer of the bottom electrode 103, the piezoelectric layer 102 and the top electrode 101 is provided with a grooved region, and the grooved region is located in the original structure and near the edge of an active region. The active region is clearly defined as the overlapping area of the top electrode 101, the piezoelectric layer 102 and the bottom electrode 103, and a reflective interface is arranged under the overlapping area.

Figure 10:
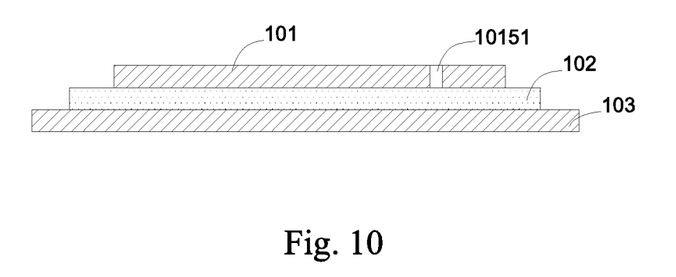
FIG. 10 is an AA sectional view of FIG. 9.
Figure 11:
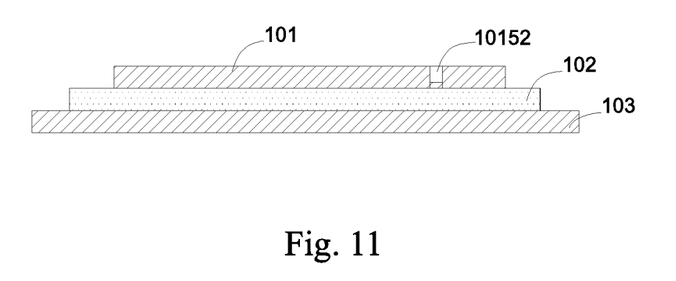
FIG. 11 is another AA sectional view of FIG. 9.

Taking the top electrode 101 as an example, as shown in FIG. 9, at least one grooved region 1015 is arranged at any position of the middle of the top electrode 101. The height of the grooved region 1015 is less than or equal to the thickness of the original structure. When the height of the grooved region 1015 is equal to that of the original structure, as shown in FIG. 10, the grooved region is a hollow block 10151; and when the height of the grooved region 1015 is less than that of the original structure, as shown in FIG. 11, the grooved region is a non-hollow grooved region 10152.

The present embodiment is applicable to film bulk acoustic resonators shown in FIGS. 1, 2 and 3.

Embodiment 7

Figure 12:
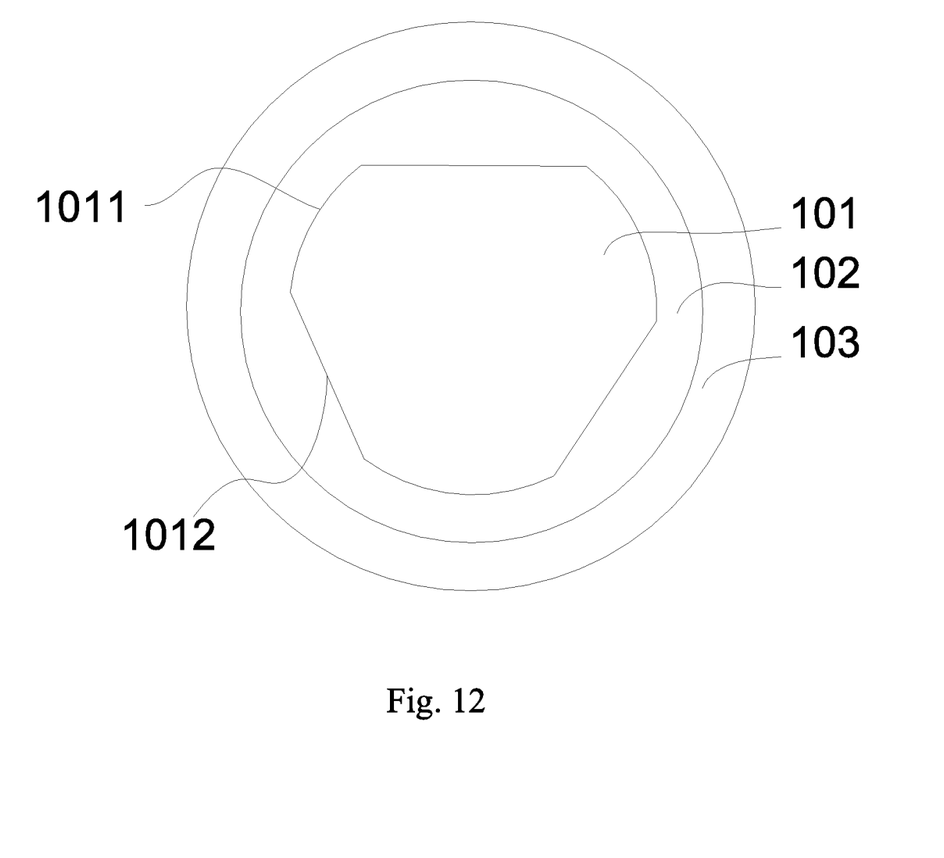
FIG. 12 is a top view of Embodiment 7 of the present invention.

The present embodiment provides a film bulk acoustic resonator, as shown in FIG. 12, which includes a substrate 105, a bottom electrode 103, a piezoelectric layer 102 and a top electrode 101 which are sequentially arranged from bottom to top, wherein, a reflective interface is arranged between the substrate 105 and the bottom electrode 103, and at least one layer of the bottom electrode 103, the piezoelectric layer 102 and the top electrode 101 is provided with a grooved region. In this embodiment, the grooved region is arranged at the edge of the original structure, and the outer perimeter of the original structure is provided with at least one linear edge, which is used for cutting off a piece of the edge of the original structure to form a grooved region. Therefore, only the outer perimeter of the growing layered structure needs to be defined in each process layer, and additional increasing of a process is not needed.

Taking the top electrode 101 as an example, three linear edges 1012 are arranged on the top electrode outer perimeter 1011. The length of each linear edge 1012 can be the same or different. In addition, one linear edge can be arranged on the top electrode 101, two linear edges can be arranged on the piezoelectric layer 102, and three linear edges can be arranged on the bottom electrode 103. The number of linear edges in each layer is not limited, and the layer in which the linear edges are arranged and the number of layers in which the linear edges are arranged are not limited. The linear edge length range is 1 nm-100 μm.

In addition, the grooved region on the edge of the original structure is not limited to the linear edge of the straight line, but also can be other shapes, such as a notch.

The material of the piezoelectric layer is composed of materials with piezoelectric characteristics, such as AN, AlScN, ZnO, PZT, LiNO$_3$, LiTaO$_3$, BST, and other material with piezoelectric characteristics or mixed materials with piezoelectric characteristics.

The present embodiment is applicable to film bulk acoustic resonators shown in FIGS. 1, 2 and 3.

The core of Embodiments 4 to 7 is to only define the shape of at least one layer without additionally increasing the number of process layers, such as adding a protruding block or a grooved region to adjust the shape of the top electrode, the piezoelectric layer or the bottom electrode, so as to attenuate the energy of transverse mode, reduce the reflection energy of transverse mode and increase the Q value.

Embodiment 8

Figure 13:
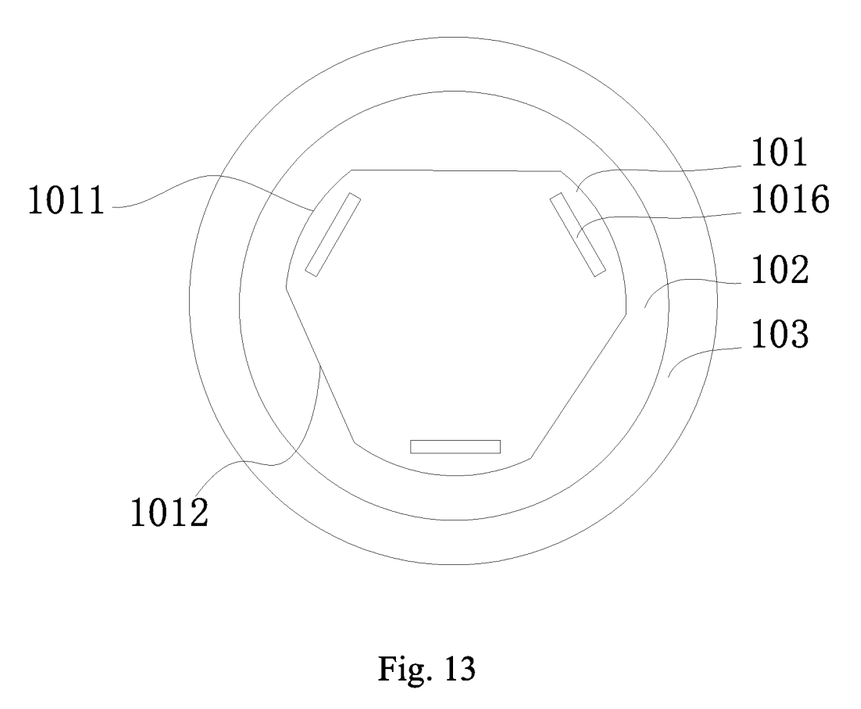
FIG. 13 is a top view of Embodiment 8 of the present invention.

The present embodiment provides a film bulk acoustic resonator, as shown in FIG. 13, which includes a bottom electrode 103, a piezoelectric layer 102 and a top electrode 101 which are sequentially arranged from bottom to top. At least one layer of the bottom electrode 103, the piezoelectric layer 102 and the top electrode 101 is provided with a grooved region, and a top electrode protruding block 1016 is arranged at the upper part of the top electrode. In the present embodiment, the grooved region is arranged at the edge of the original structure, and at least one linear edge is arranged on the outer perimeter of the original structure, which is used for cutting off a piece of the edge of the original structure to form a grooved region.

Taking the top electrode 101 as an example, three linear edges 1012 are arranged on the top electrode outer perimeter 1011, and the length of each linear edge 1012 can be the same or different. In addition, one linear edge can be arranged on the top electrode 101, two linear edges can be arranged on the piezoelectric layer 102, and three linear edges can be arranged on the bottom electrode 103. The number of the linear edges in each layer is not limited, and the layer in which the linear edges are arranged and the number of layers in which the linear edges are arranged are not limited. The linear edge length range is 1 nm-100 μm.

In this embodiment, three top electrode protruding blocks 1016 are arranged and are circumferentially and evenly distributed on the upper part of the top electrode. The number and arrangement mode of the top electrode protruding blocks 1016 can be arbitrary.

The material of the piezoelectric layer is composed of materials with piezoelectric characteristics, such as AN, AlScN, ZnO, PZT, LiNO$_3$, LiTaO$_3$, BST and other materials with piezoelectric characteristics or mixed materials with piezoelectric characteristics.

The present embodiment is applicable to film bulk acoustic resonators shown in FIGS. 1, 2 and 3.

Embodiment 9

Figure 14:
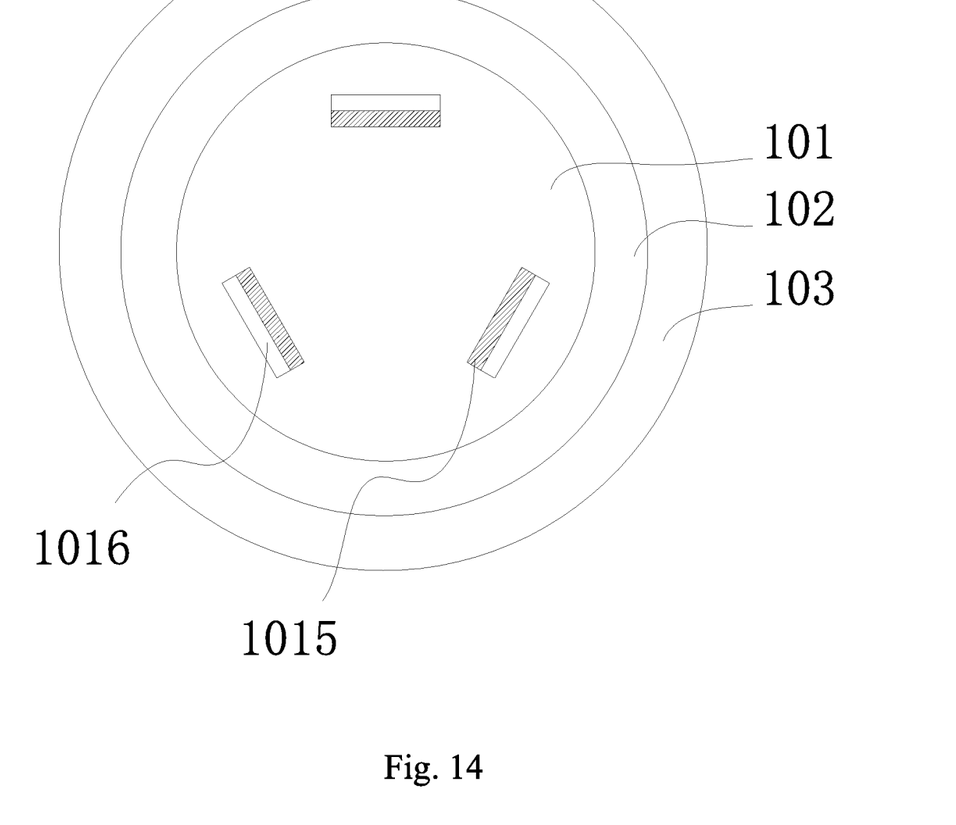
FIG. 14 is a top view of Embodiment 9 of the present invention.

The present embodiment provides a film bulk acoustic resonator, as shown in FIG. 14, which includes a bottom electrode 103, a piezoelectric layer 102 and a top electrode 101 which are sequentially arranged from bottom to top. At least one layer of the bottom electrode 103, the piezoelectric layer 102 and the top electrode 101 is provided with a grooved region, and at least one top electrode protruding block 1016 is arranged at the upper part of the top electrode. In this embodiment, the grooved region is located in the original structure and near the edge of an active region. The active region is clearly defined as the overlapping area of the top electrode 101, the piezoelectric layer 102 and the bottom electrode 103, and a reflective interface is arranged under the overlapping area.

Taking the top electrode 101 as an example, at least one grooved region 1015 is arranged at any position of the middle of the top electrode 101. The height of the grooved region 1015 is less than or equal to the thickness of the original structure. In this embodiment, three top electrode protruding blocks 1016 are arranged and are circumferentially and evenly distributed on the upper part of the top electrode. The number and arrangement mode of the top electrode protruding blocks 1016 can be arbitrary.

The material of the piezoelectric layer is composed of materials with piezoelectric characteristics, such as AN, AlScN, ZnO, PZT, LiNO$_3$, LiTaO$_3$, BST, and other material with piezoelectric characteristics or mixed materials with piezoelectric characteristics.

The present embodiment is applicable to film bulk acoustic resonators shown in FIGS. 1, 2 and 3.

The core of Embodiments 8 and 9 is to combine the characteristics of protruding blocks and grooved regions to achieve better results.

Embodiment 10

The film bulk acoustic resonator in the present embodiment includes a layered structure composed of a top electrode, a piezoelectric layer and a bottom electrode, and a substrate; a reflective interface is arranged between the bottom electrode and the substrate; the outer perimeter of the layered structure is a closed line formed by connecting a curve and at least one straight line segment; and at least one layer of the top electrode, the piezoelectric layer and the bottom electrode is provided with a protruding block or a grooved region.

Figure 15:
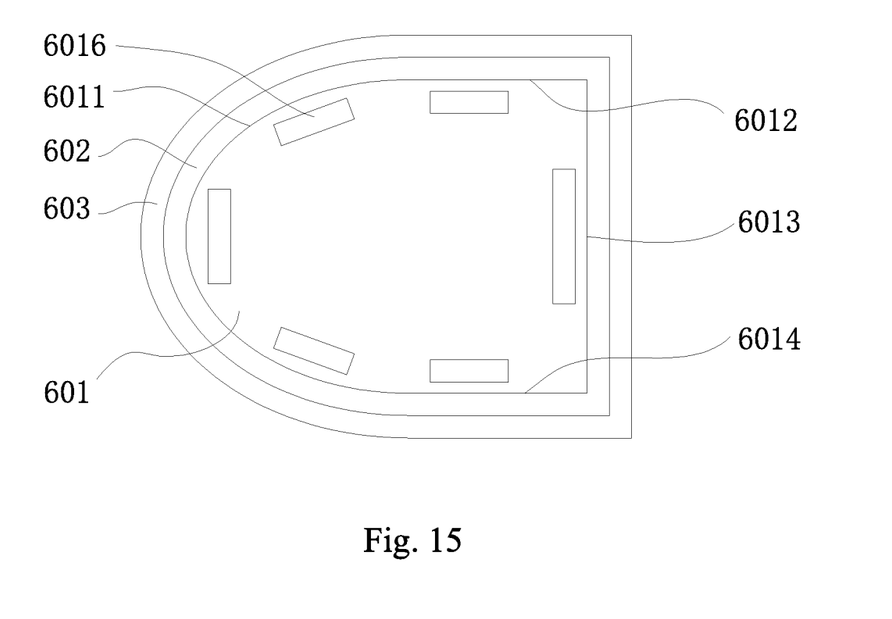
FIG. 15 is a top view of Embodiment 10 of the present invention.

As shown in FIG. 15, taking the top electrode 601 as an example, the closed line of the top electrode 601 is formed by connecting a convex curve 6011, a first straight line segment 6012, a second straight line segment 6013 and a third straight line segment 6014. The first straight line segment 6012 and the third straight line segment 6014 are parallel to each other; and at least one top electrode protruding block 6016 is arranged at the upper part of the top electrode.

The material of the piezoelectric layer is composed of materials with piezoelectric characteristics, such as AN, AlScN, ZnO, PZT, LiNO$_3$, LiTaO$_3$, BST and other materials with piezoelectric characteristics or mixed materials with piezoelectric characteristics.

The present embodiment is applicable to film bulk acoustic resonators shown in FIGS. 1, 2 and 3.

The core of embodiment 10 is to combine the two ways of "asymmetric outer perimeter" and "adding a protruding block or a grooved region" to achieve better results.

The above embodiments are merely used for illustrating the design ideas and characteristics of the present invention, and are intended to aid those of ordinary skill in the art in understanding and implementing the invention. The scope of protection of the invention is not limited to the above embodiments. Therefore, any equivalent changes or modifications made in accordance with the principles and design ideas disclosed by the present invention are within the scope of protection of the present invention.

What is claimed is:

1. A film bulk acoustic resonator, comprising a layered structure composed of a top electrode, a piezoelectric layer and a bottom electrode, and a substrate, characterized in that a reflective interface is arranged between the bottom electrode and the substrate; the outer perimeter of the layered structure is a closed line formed by connecting a curve and at least one straight line segment,     wherein at least one layer of the bottom electrode, the piezoelectric layer and the top electrode is provided with at least one protruding block, and     wherein the at least one protruding block is disposed on a surface of an original structure of the at least one layer, such that a thickness of the at least one layer at a location in which the at least one protruding block is located is greater than a thickness of the original structure, or the at least one protruding block is disposed at a periphery of the original structure of the at least one layer and on a surface of a lower layer on which the original structure of the at least one layer is formed, and is connected with or at a distance from the original structure.

2. The film bulk acoustic resonator according to claim 1, characterized in that the curve is convex or concave.

3. The film bulk acoustic resonator according to claim 1, characterized in that a number of the straight line segments is two or more, and an angle between adjacent straight line segments is greater than 0 degrees and less than 180 degrees.

4. The film bulk acoustic resonator according to claim 1, characterized in that a number of the straight line segments is three or more, and at least two of the straight line segments are parallel to each other.

5. The film bulk acoustic resonator according to claim 1, characterized in that the reflective interface is a cavity between the bottom electrode and the substrate.

6. The film bulk acoustic resonator according to claim 1, characterized in that the reflective interface is formed by overlapping high acoustic impedance materials and low acoustic impedance materials.

7. The film bulk acoustic resonator according to claim 1, characterized in that the piezoelectric layer is made of a material with piezoelectric characteristics.

8. The film bulk acoustic resonator according to claim 7, characterized in that the material with piezoelectric characteristics is AlN, AlScN, ZnO, PZT, LiNO3 or LiTaO3.

9. A film bulk acoustic resonator, comprising a substrate, a bottom electrode, a piezoelectric layer ad a top electrode which are sequentially arranged from bottom to top, wherein, a reflective interface is arranged between the substrate and the bottom electrode, and characterized in that at least one layer of the bottom electrode, the piezoelectric layer and the top electrode has a different shape from the other layers,     wherein at least one layer of the bottom electrode, the piezoelectric layer and the top electrode is provided with at least one protruding block, and     wherein the at least one protruding block is disposed on a surface of an original structure of the at least one layer, such that a thickness of the at least one layer at a location in which the at least one protruding block is located is greater than a thickness of the original structure, or the at least one protruding block is disposed at a periphery of the original structure of the at least one layer and on a surface of a lower layer on which the original structure of the at least one layer is formed, and is connected with or at a distance from the original structure.

10. The film bulk acoustic resonator according to claim 9, characterized in that the different shape means that at least one protruding block is added.

11. The film bulk acoustic resonator according to claim 9, characterized in that the certain distance is greater than 0 and less than or equal to 100 um.

12. The film bulk acoustic resonator according to claim 9, characterized in that the different shape means that at least one grooved region is arranged on the original structure.

13. The film bulk acoustic resonator according to claim 12, characterized in that the grooved region is arranged at any position in an edge or a middle of the original structure.

14. The film bulk acoustic resonator according to claim 12, characterized in that a height of the grooved region is less than or equal to the thickness of the original structure.

15. The film bulk acoustic resonator according to claim 14, characterized in that the piezoelectric layer is made of a material with piezoelectric characteristics.

16. The film bulk acoustic resonator according to claim 15, characterized in that the material of the piezoelectric layer is one of AN, AlScN, ZnO, PZT, LiNO3, LiTaO3 and BST.

17. The film bulk acoustic resonator according to claim 9, characterized in that the different shape is that at least one protruding block is added, and at least one grooved region is arranged on the original structure.

* * * * *